(12) United States Patent
Bennett

(10) Patent No.: US 6,539,534 B1
(45) Date of Patent: Mar. 25, 2003

(54) APPARATUS AND METHOD FOR AUTOMATICALLY GENERATING CIRCUIT DESIGNS THAT MEET USER OUTPUT REQUIREMENTS

(75) Inventor: David W. Bennett, Erie, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/809,597

(22) Filed: Mar. 14, 2001

Related U.S. Application Data
(60) Provisional application No. 60/228,256, filed on Aug. 25, 2000.

(51) Int. Cl.[7] .............................................. G06F 17/50
(52) U.S. Cl. ........................................... 716/17; 716/16
(58) Field of Search .............................. 716/16, 17, 18, 716/4, 12, 13, 1, 2, 3, 5, 14, 15; 326/39; G06F 17/50; H03K 19/00

(56) References Cited

U.S. PATENT DOCUMENTS

| | | | | |
|---|---|---|---|---|
| 4,964,056 A | * | 10/1990 | Bekki et al. ................. 364/488 |
| 5,517,132 A | * | 5/1996 | Ohara ........................... 326/41 |
| 5,530,841 A | | 6/1996 | Gregory et al. ............. 395/500 |
| 5,801,958 A | * | 9/1998 | Dangelo et al. .............. 716/18 |
| 5,812,414 A | * | 9/1998 | Butts et al. .................... 703/13 |
| 5,867,397 A | * | 2/1999 | Koza et al. .................... 703/14 |

OTHER PUBLICATIONS

U.S. patent application Ser. No. 09/335,862, Levi et al., filed Jun. 17, 1999.

* cited by examiner

*Primary Examiner*—Don Wong
*Assistant Examiner*—Trinh Vo Dinh
(74) *Attorney, Agent, or Firm*—Jeanette S. Harms; Bever Hoffman & Harms; Edel M. Young

(57) ABSTRACT

A method for generating a circuit design using specified input characteristics and desired output characteristics. An algorithm is used to generate candidate circuits from the desired circuit characteristics. The candidate circuit is tested with a stimulating test apparatus to provide actual output characteristics in response to the specified input characteristics. If the actual and desired output characteristics do not match, the candidate circuit is modified and re-tested. The design process may be automated or manual.

20 Claims, 3 Drawing Sheets

APPARATUS AND METHOD FOR AUTOMATICALLY GENERATING CIRCUIT DESIGNS THAT MEET USER OUTPUT REQUIREMENTS

RELATED APPLICATION

This application claims priority to U.S. provisional application Ser. No. 60/228,256 entitled "Apparatus and Method for Automatically Generating Circuit Designs that Meet User Output Requirements" filed Aug. 25, 2000.

FIELD OF THE INVENTION

The present invention relates to programmable logic devices (PLDs) and particularly to design methods for PLDs.

BACKGROUND OF THE INVENTION

FIG. 1 is a flow diagram illustrating a conventional circuit design process that is used to design circuits implemented on PLDs, and also to design application specific integrated circuits (ASICs).

The conventional circuit design process begins in step 101 by defining a desired circuit using known schematic capture tools or hardware description languages (HDL) such as VHDL and Verilog. In addition, the circuit definition step requires defining a set of input signals and associated desired output signals that are to be generated by the circuit design. Because conventional circuit schematic capture and HDL are often cryptic and complex, the step of defining the desired circuit is often time consuming.

After the desired circuit is defined in step 101, the circuit definition is then synthesized using known software tools (step 102), and then simulated (step 103) in software. If bugs are detected in the circuit simulation, i.e., the synthesized circuit definition fails to generate the desired output signals in response to the defined input signals (Bugs Found in step 104), then the circuit definition is manually modified (step 105), synthesized (step 102) and simulated (103) until a suitable finalized circuit design is achieved (step 106). Note that, in step 105, the circuit designer must manually alter the design definition to fix the bugs. Most of the design time in the conventional circuit design process is spent in debugging the circuit design (step 104) and manually fixing bugs (step 105) to generate a finalized circuit design (step 106). In the case of circuit designs implemented on PLDs, the finalized circuit design is then converted into a bitstream (step 107) that can be loaded into a target PLD.

As mentioned above, the conventional circuit design process is complex and time consuming because the logic performed by the desired circuit must be defined using, for example, a schematic capture tool. In addition, the process of debugging a circuit definition often requires significant time and resources.

Third party vendors are presently attempting to address the complexity of the conventional circuit design process by providing software tools that generate a circuit design based only on the desired circuit behavior (i.e. predefined output signals are associated with a given set of input signals) without the use of a logic description defined using schematic capture or HDL. One such method is entitled "Method for Converting a Hardware Independent User Description of a Logic Circuit into Hardware Components" by Gregory et al., U.S. Pat. No. 5,530,841. These attempts use a single pass through a software algorithm to generate a single candidate circuit based on the desired circuit behavior. A bitstream is then generated from this single candidate circuit to finalize this conventional design without hardware verification. Although the resulting circuit design process is much less time consuming than the conventional design process, a problem arises in that the behavior characteristics of the candidate circuit generated may not match the characteristics of the desired circuit.

What is needed is an automatic method of generating a circuit design using desired circuit behavior that is guaranteed to operate in its target device, for example, a target PLD.

SUMMARY OF THE INVENTION

The present invention is directed to an apparatus and a method for designing a circuit having desired output characteristics by iteratively evaluating the hardware implementations of intermediate designs. The initial circuit is defined in response to specified input characteristics. By using only the input and output characteristics of the desired circuit, the cryptic and complex methods of circuit description, such as schematic capture or HDL, is prevented. As a result, the process of design definition takes less time and is significantly simplified, and the most time consuming steps of debugging and bug fixing are fully automated.

Desired circuit characteristics are defined at the beginning of the design process. An algorithm is used to generate a candidate circuit from the desired circuit characteristics. This candidate circuit may be recursively modified to ensure that the final circuit behavior matches the desired circuit characteristics.

In contrast with the conventional software-only approach, the present invention programs a PLD with a bitstream generated from the candidate circuit. The programmed PLD is tested with a hardware stimulating test apparatus to provide actual output characteristics in response to the specified input characteristics. This stimulating test apparatus stimulates the PLD and records the actual PLD response characteristics. If the actual PLD response characteristics and the desired circuit characteristics do not match, then the candidate circuit is modified and re-tested recursively until a final circuit solution is obtained based solely on characteristic behavior. This recursive process may be accomplished automatically or manually. In this way, the final circuit output characteristics match the desired output characteristics.

DETAILED DESCRIPTION OF THE INVENTION

Figure 1:
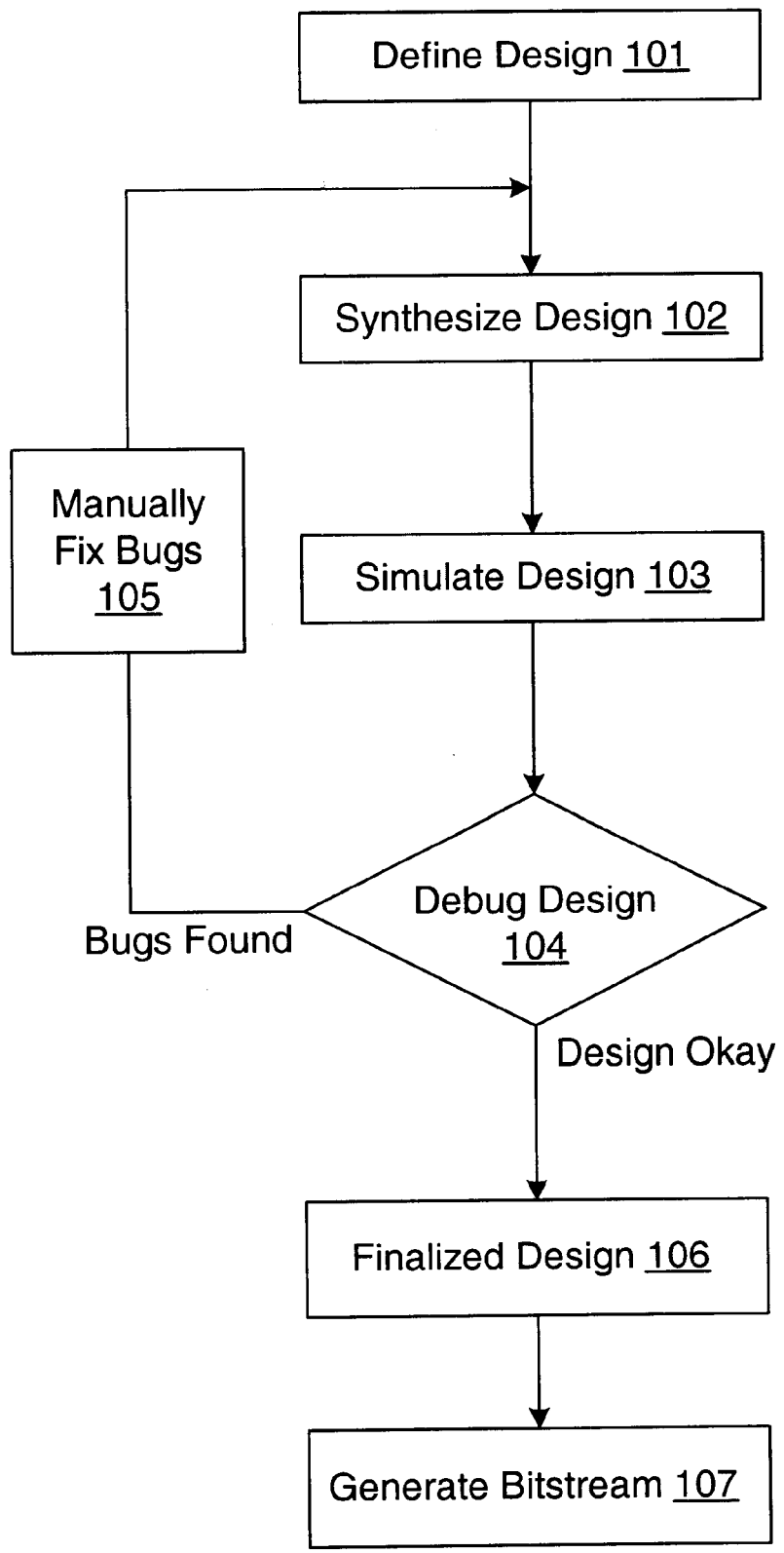
FIG. 1 is a flow diagram of a conventional circuit design method.
Figure 2:
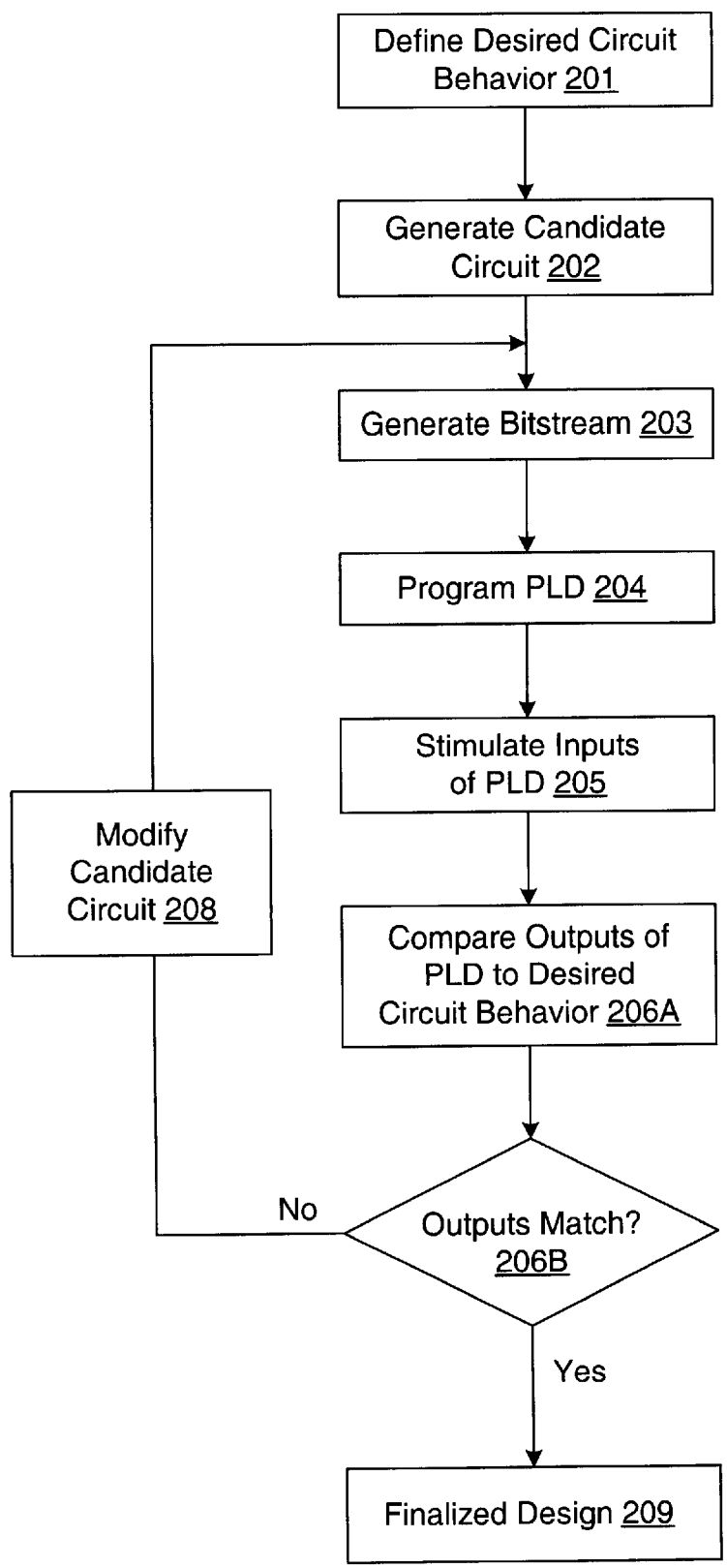
FIG. 2 is a flow diagram of a method for generating a circuit design in accordance with the present invention.

FIG. 2 is a flow diagram of a method for automatically generating a circuit design based on desired circuit behavior in accordance with the present invention.

The desired circuit behavior is defined in step 201 as the output characteristics of the desired circuit in response to specified input characteristics. As stated above, this information is also required during conventional methods. In a first embodiment of the present invention, this desired circuit behavior is described as a set of input waveforms and the expected output waveforms. In another embodiment of the present invention, this desired circuit behavior is defined as a test bench in VHDL. A testbench is HDL code written for a simulator that instantiates the design netlist(s), initializes the design, and then applies stimuli to verify the functionality of the design. The testbench can also be set up to display the desired simulation output characteristics to a file, waveform, or screen. A testbench allows repeatable simulation throughout the design process and also provides documentation of the test conditions. Other embodiments may use other available methods for describing this desired behavior.

A candidate circuit is generated in step 202 by an algorithm. In a particular embodiment, the algorithm used is a logic synthesis algorithm attempting to generate the desired behavior. An example of such a logic synthesis algorithm is described in Gregory et al., U.S. Pat. No. 5,530,841. In another embodiment, the algorithm used is a genetic algorithm generating a random circuit that will later be evolved to perform the desired behavior. A genetic algorithm is described by Levi and Guccione in U.S. patent application Ser. No. 09/335,862 entitled "Method And Apparatus For Evolving Configuration Bitstreams", which is incorporated herein by reference. The generated candidate circuit may or may not exactly perform the desired behavior.

A bitstream is formed from the candidate circuit in step 203. This bitstream is used to program a programmable logic device (PLD). Using a stimulating test apparatus, the inputs of the PLD are stimulated to simulate the input characteristics defining the desired circuit behavior in step 201. This stimulating test apparatus monitors the output characteristics in response to these input characteristics.

In step 206, the output characteristics generated in step 205 are compared to the desired circuit behavior defined in step 201. If the desired output characteristics and the actual output characteristics match, the candidate circuit is finalized in step 209. The bitstream generated in step 203 is used in finalized design step 209.

In step 206, if the output characteristics generated in step 205 do not match the actual output characteristics, then the initial candidate circuit is modified in some way in step 208. The modification of the candidate circuit in step 208 may be accomplished in several ways. These ways include, but are not limited to, resynthesizing the circuit with the aforementioned logic synthesis algorithm, using a genetic algorithm to evolve the circuit toward a more fit circuit, and using simulated annealing to slightly modify the circuit until a correct result is produced.

Step 203 creates a bitstream from the modified circuit of step 208 and re-programs the PLD. This process is followed until the desired output characteristics are generated by the candidate circuit and the design is finalized in step 209. The entire process may be automated such that a user needs only to input the desired input and output characteristics and wait for the recursive process to generate a correct finalized design having those characteristics.

Figure 3:
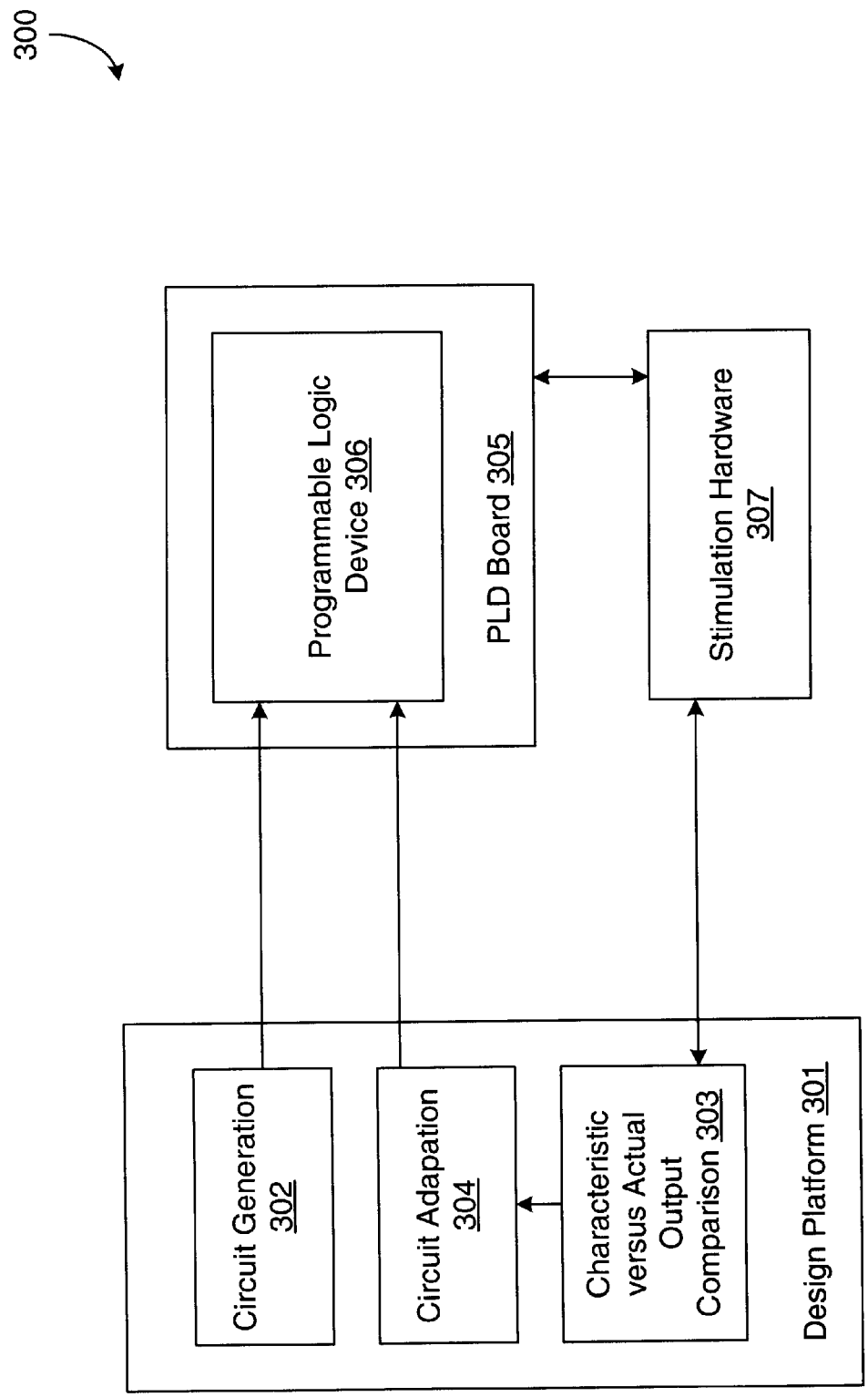
FIG. 3 is a block diagram of an apparatus for generating a circuit design in accordance with the present invention.

FIG. 3 is a block diagram of a circuit design generator 300 in accordance with an embodiment of the present invention. Circuit design generator includes design platform 301, PLD board 305 and stimulation hardware 307. Design platform 301 includes circuit generation tool 302, characteristic versus actual output comparison tool 303 and circuit adaptation tool 304. PLD board 305 includes PLD 306.

Referring to FIGS. 2 and 3, circuit generation tool 302 provides the candidate circuit and associated bitstream of steps 202–203. This bitstream is used to program PLD 306 on PLD board 305. Stimulation hardware 307 is used to accomplish step 205. Comparison tool 303 is used to accomplish steps 206A–206B. In a particular embodiment, comparison tool 303 is the SoftSell VersaTest system. Circuit adaptation tool 304 accomplishes the modification of the candidate circuit in step 208 and the generation of the associated bitstream in step 203.

Although the invention has been described in connection with one embodiment, it is understood that this invention is not limited to the embodiment disclosed, but is capable of various modifications which would be apparent to a person skilled in the art. For example, another stimulating test apparatus besides the Softsell VersaTest board may be used to stimulate the PLD in step 205. Thus, the invention is limited only by the following claims.

I claim:

1. A method of designing a circuit to be implemented in a PLD comprising the steps of:

defining a designed circuit behavior having desired output characteristics resulting from specified input characteristics;

generating a candidate circuit for performing the desired circuit behavior using an algorithm other than a genetic algorithm;

programming the PLD to implement the candidate circuit;

stimulating the PLD with the specified input characteristics and obtaining actual output characteristics of the PLD resulting from the PLD stimulation; and comparing the actual output characteristics of the PLD to the desired output characteristics of the desired circuit behavior.

2. The method of claim 1 wherein the desired circuit behavior is described as output waveforms resulting from a set of input waveforms.

3. The method of claim 1 wherein the desired circuit behavior is described using a test bench.

4. The method of claim 1 wherein the candidate circuit is generated using a logic synthesis algorithm.

5. The method of claim 4 wherein when the step of comparing the outputs of the candidate circuit to the desired outputs fails to result in a match, a different candidate circuit is generated and subsequent steps are repeated.

6. The method of claim 5 wherein the different candidate circuit is generated by resynthesizing the candidate circuit.

7. The method of claim 6 wherein the step of resynthesizing the candidate circuit is performed using the logic synthesis algorithm.

8. The method of claim 1 further comprising the steps of:

evolving the candidate circuit into a different candidate circuit based on the comparison of the actual output characteristics of the PLD to the desired output characteristics of the desired circuit behavior; and recursively evaluating the different candidate circuit in the same manner as the candidate circuit.

9. The method of claim 8 wherein the different candidate circuit is generated by a simulated annealing algorithm.

10. The method of claim 1 wherein the step of stimulating the PLD and obtaining actual output characteristics is performed by a printed circuit board attached to a computer.

11. The method of claim 1 wherein when the step of comparing the outputs of the candidate circuit to the desired outputs fails to result in a match, a different candidate circuit is generated and subsequent steps are repeated.

12. The method of claim 11 wherein the different candidate circuit is generated by resynthesizing the circuit.

13. The method of claim 11 wherein the different candidate circuit is generated using a genetic algorithm.

14. The method of claim 11 wherein the different candidate circuit is generated by a simulated annealing algorithm.

15. The method of claim 1, wherein the desired circuit behavior defined depends on the PLD implementing the circuit.

16. An apparatus for designing a circuit to be implemented in a PLD comprising:

means for defining a desired circuit behavior in terms of the desired output characteristics resulting from specified input characteristics;

means other than a genetic algorithm for generating a candidate circuit for performing the desired circuit behavior;

a PLD for implementing the candidate circuit;

stimulation hardware for stimulating the PLD with the specified input characteristics and obtaining actual output characteristics of the PLD resulting from the PLD stimulation; and means for comparing the actual output characteristics of the PLD to the desired output characteristics of the desired circuit behavior.

17. The apparatus of claim 16 further comprising means for recursively adapting the candidate circuit.

18. The apparatus of claim 16 further comprising means for automating the design of the circuit.

19. A method of designing a circuit comprising the steps of:

defining a desired circuit behavior having desired output characteristics resulting from specified input characteristics;

generating a first candidate circuit for performing the desired circuit behavior using an algorithm other than a genetic algorithm;

testing the first candidate circuit to obtain actual output characteristics;

comparing the actual output characteristics to the desired output characteristics;

evolving the first candidate circuit into a second candidate circuit when the actual output characteristics do not match the desired output characteristics; and recursively evaluating the second candidate circuit in the same manner as the first candidate circuit.

20. A method of designing a circuit comprising the steps of:

defining a desired circuit behavior having desired output characteristics resulting from specified input characteristics;

generating a first candidate circuit for performing the desired circuit behavior;

testing the first candidate circuit to obtain actual output characteristics;

comparing the actual output characteristics to the desired output characteristics;

evolving the first candidate circuit into a second candidate circuit using simulated annealing when the actual output characteristics do not match the desired output characteristics; and recursively evaluating the second candidate circuit in the same manner as the first candidate circuit.

* * * * *